(12) United States Patent
Savas et al.

(10) Patent No.: US 12,347,677 B2
(45) Date of Patent: Jul. 1, 2025

(54) ENHANCED IGNITION IN INDUCTIVELY COUPLED PLASMAS FOR WORKPIECE PROCESSING

(71) Applicants: Beijing E-Town Semiconductor Technology Co., Ltd., Beijing (CN); Mattson Technology, Inc., Fremont, CA (US)

(72) Inventors: Stephen E. Savas, Pleasanton, CA (US); Shawming Ma, Sunnyvale, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 0 days.

(21) Appl. No.: 18/503,681

(22) Filed: Nov. 7, 2023

(65) Prior Publication Data

US 2024/0071754 A1    Feb. 29, 2024

Related U.S. Application Data

(60) Continuation of application No. 17/827,198, filed on May 27, 2022, now Pat. No. 11,848,204, which is a
(Continued)

(51) Int. Cl.
*H01L 21/02* (2006.01)
*H01J 37/32* (2006.01)
(Continued)

(52) U.S. Cl.
CPC .. *H01L 21/02315* (2013.01); *H01J 37/32119* (2013.01); *H01J 37/32651* (2013.01);
(Continued)

(58) Field of Classification Search
CPC ......... H01L 21/02315; H01L 21/02348; H01L 21/67207; H01L 21/263; H01L 21/762;
(Continued)

(56) References Cited

U.S. PATENT DOCUMENTS

| 4,731,255 A | 3/1988 | Maeda et al. |
| 5,449,432 A | 9/1995 | Hanawa |

(Continued)

FOREIGN PATENT DOCUMENTS

| CN | 112151364 | 12/2020 |
| JP | H09115694 A | 5/1997 |
| WO | WO 2010068542 | 6/2010 |
| WO | WO 2020225920 | 11/2020 |
| WO | WO 2021247249 | 12/2021 |

OTHER PUBLICATIONS

Supplementary European Search Report for Application No. 20851516, mailed Aug. 29, 2022, 9 pages.
(Continued)

*Primary Examiner* — Thanh T Nguyen
(74) *Attorney, Agent, or Firm* — Dority & Manning, P.A.

(57) ABSTRACT

Plasma processing apparatus and associated methods are provided. In one example, a plasma processing apparatus includes a plasma chamber. The plasma processing apparatus includes a dielectric wall forming at least a portion of the plasma chamber. The plasma processing apparatus includes an inductive coupling element located proximate the dielectric wall. The plasma processing apparatus includes an ultraviolet light source configured to emit an ultraviolet light beam onto a metal surface that faces an interior volume of the plasma chamber. The plasma processing apparatus includes a controller configured to control the ultraviolet light source.

15 Claims, 6 Drawing Sheets

Related U.S. Application Data division of application No. 16/547,724, filed on Aug. 22, 2019, now Pat. No. 11,348,784, which is a continuation-in-part of application No. 16/537,748, filed on Aug. 12, 2019, now abandoned.

(51) Int. Cl.
*H01L 21/263* (2006.01)
*H01L 21/67* (2006.01)
*H01L 21/762* (2006.01)

(52) U.S. Cl.
CPC .. *H01L 21/02348* (2013.01); *H01L 21/67207* (2013.01); *H01J 37/32449* (2013.01); *H01L 21/263* (2013.01); *H01L 21/762* (2013.01)

(58) Field of Classification Search
CPC .......... H01L 21/67115; H01J 37/32119; H01J 37/32651; H01J 37/32449; H01J 37/32321; H01J 37/32339; H01J 37/32477; H01J 37/321; H01J 37/32082; Y02E 30/10
See application file for complete search history.

(56) References Cited

U.S. PATENT DOCUMENTS

| | | |
|---|---|---|
| 5,685,941 A | 11/1997 | Forster et al. |
| 5,696,428 A | 12/1997 | Pasch |
| 5,710,486 A | 1/1998 | Ye et al. |
| 5,865,896 A | 2/1999 | Nowak et al. |
| 5,911,832 A | 6/1999 | Denholm et al. |
| 5,959,404 A | 9/1999 | Notrup et al. |
| 5,986,747 A | 11/1999 | Moran |
| 6,098,637 A | 8/2000 | Parke |
| 6,222,320 B1 | 4/2001 | Stockwald |
| 6,268,698 B1 | 7/2001 | Scholz |
| 6,317,514 B1 | 11/2001 | Reinhorn et al. |
| 6,400,087 B2 | 6/2002 | Van den Nieuwenhuizen et al. |
| 6,447,636 B1 | 9/2002 | Qian et al. |
| 6,566,278 B1 | 5/2003 | Harvey et al. |
| 6,569,775 B1 | 5/2003 | Loewenhardt et al. |
| 6,614,181 B1 | 9/2003 | Harvey et al. |
| 6,671,398 B2 | 12/2003 | Reinhorn et al. |
| 6,703,321 B2 | 3/2004 | Geiger et al. |
| 6,753,129 B2 | 6/2004 | Livesay et al. |
| 7,000,565 B2 | 2/2006 | Fukuda et al. |
| 7,018,941 B2 | 3/2006 | Cui et al. |
| 7,160,671 B2 | 1/2007 | Ko et al. |
| 7,497,964 B2 | 3/2009 | Igeta et al. |
| 7,501,355 B2 | 5/2009 | Bhatia et al. |
| 7,547,633 B2 | 6/2009 | Ranish et al. |
| 7,566,891 B2 | 7/2009 | Rocha-Alavarez et al. |
| 7,589,336 B2 | 9/2009 | Kaszuba et al. |
| 7,605,008 B2 | 10/2009 | Chua et al. |
| 7,648,927 B2 | 1/2010 | Singh et al. |
| 7,651,955 B2 | 1/2010 | Ranish et al. |
| 7,663,121 B2 | 2/2010 | Nowak et al. |
| 7,777,198 B2 | 8/2010 | Rocha-Alavarez et al. |
| 7,798,096 B2 | 9/2010 | Mahajani et al. |
| 7,803,722 B2 | 9/2010 | Liang |
| 7,851,368 B2 | 12/2010 | Hudson et al. |
| 7,909,595 B2 | 3/2011 | Kaszuba et al. |
| 7,951,730 B2 | 5/2011 | Bhatia et al. |
| 7,982,400 B2 | 7/2011 | Kostrun et al. |
| 7,993,733 B2 | 8/2011 | Stowell et al. |
| 8,129,290 B2 | 3/2012 | Balseanu et al. |
| 8,138,104 B2 | 3/2012 | Balseanu et al. |
| 8,168,269 B2 | 5/2012 | Mahajani et al. |
| 8,203,126 B2 | 6/2012 | Rocha-Alavarez et al. |
| 8,216,861 B1 | 7/2012 | Yim et al. |
| 8,232,538 B2 | 7/2012 | Sant et al. |
| 8,283,644 B2 | 10/2012 | Smargiassi et al. |
| 8,309,421 B2 | 11/2012 | Yang et al. |
| 8,387,557 B2 | 3/2013 | Singh et al. |
| 8,455,849 B2 | 6/2013 | Baluja et al. |
| 8,492,170 B2 | 7/2013 | Xie et al. |
| 8,492,736 B2 | 7/2013 | Wang et al. |
| 8,525,139 B2 | 9/2013 | Singh et al. |
| 8,584,612 B2 | 11/2013 | Hart et al. |
| 8,597,011 B2 | 12/2013 | Kaszuba et al. |
| 8,603,292 B2 | 12/2013 | Augustino et al. |
| 8,618,734 B2 | 12/2013 | Buttstaedt et al. |
| 8,624,210 B2 | 1/2014 | Wang et al. |
| 8,657,961 B2 | 2/2014 | Xie et al. |
| 8,664,855 B2 | 3/2014 | Buttstaedt et al. |
| 8,679,594 B2 | 3/2014 | Stowell et al. |
| 8,679,987 B2 | 3/2014 | Reilly et al. |
| 8,753,449 B2 | 6/2014 | Chhabra et al. |
| 8,753,804 B2 | 6/2014 | Cheng et al. |
| 8,758,638 B2 | 6/2014 | Ye et al. |
| 8,841,629 B2 | 9/2014 | Hendrickson et al. |
| 8,877,659 B2 | 11/2014 | Chan et al. |
| 8,911,553 B2 | 12/2014 | Baluja et al. |
| 8,946,057 B2 | 2/2015 | Lei et al. |
| 8,969,177 B2 | 3/2015 | Chowdhury et al. |
| 9,028,765 B2 | 5/2015 | Gvtri et al. |
| 9,053,921 B2 | 6/2015 | Buttstaedt et al. |
| 9,058,980 B1 | 6/2015 | Xie et al. |
| 9,123,532 B2 | 9/2015 | Chan et al. |
| 9,153,482 B2 | 10/2015 | Knisley et al. |
| 9,219,006 B2 | 12/2015 | Chatterjee |
| 9,252,024 B2 | 2/2016 | Lam et al. |
| 9,252,057 B2 | 2/2016 | Chowdhury et al. |
| 9,263,284 B2 | 2/2016 | Cheng et al. |
| 9,364,871 B2 | 6/2016 | Baluja et al. |
| 9,466,502 B2 | 10/2016 | Cheng et al. |
| 9,499,909 B2 | 11/2016 | Moffatt |
| 9,502,255 B2 | 11/2016 | Antonelli et al. |
| 9,502,263 B2 | 11/2016 | Demos et al. |
| 9,506,145 B2 | 11/2016 | Baluja et al. |
| 9,514,932 B2 | 12/2016 | Mallick et al. |
| 9,570,287 B2 | 2/2017 | Liang et al. |
| 9,580,801 B2 | 2/2017 | Ba et al. |
| 9,601,375 B2 | 3/2017 | Lei et al. |
| 9,620,379 B2 | 4/2017 | Lei et al. |
| 9,659,765 B2 | 5/2017 | Yim et al. |
| 9,740,140 B2 | 8/2017 | Ishii |
| 9,865,501 B2 | 1/2018 | Spurlin et al. |
| 9,916,977 B2 | 3/2018 | Van Cleemput et al. |
| 9,932,670 B2 | 4/2018 | Su et al. |
| 9,947,576 B2 | 4/2018 | Underwood et al. |
| 9,991,129 B1 | 6/2018 | Bajaj et al. |
| 10,157,759 B2 | 12/2018 | Ni et al. |
| 10,460,936 B2 | 10/2019 | Underwood et al. |
| 2001/0032781 A1 | 10/2001 | Fujii et al. |
| 2004/0118834 A1 | 6/2004 | Ohmi et al. |
| 2007/0072095 A1 | 3/2007 | Ko et al. |
| 2008/0063809 A1* | 3/2008 | Lee .................. H01L 21/02348 257/E21.279 |
| 2011/0095207 A1 | 4/2011 | Sant et al. |
| 2011/0097900 A1 | 4/2011 | Augustino et al. |
| 2011/0097902 A1 | 4/2011 | Singh et al. |
| 2011/0104616 A1 | 5/2011 | Cheng et al. |
| 2011/0146705 A1 | 6/2011 | Hart et al. |
| 2011/0259268 A1 | 10/2011 | Foad et al. |
| 2011/0306213 A1 | 12/2011 | Wang et al. |
| 2014/0262746 A1 | 9/2014 | Chen et al. |
| 2015/0056108 A1 | 2/2015 | Gvtri et al. |
| 2015/0316857 A1 | 11/2015 | Berry, III et al. |
| 2016/0042943 A1 | 2/2016 | Ribaudo et al. |
| 2018/0053628 A1* | 2/2018 | Vaniapura ......... H01J 37/32522 |
| 2018/0135171 A1 | 5/2018 | L'Heureux et al. |
| 2020/0035445 A1 | 1/2020 | Xu et al. |
| 2020/0071822 A1 | 3/2020 | An et al. |

OTHER PUBLICATIONS

International Search Report and Written Opinion for Application No. PCT/US, mailed Nov. 24, 2020, 11 pages.

\* cited by examiner

ENHANCED IGNITION IN INDUCTIVELY COUPLED PLASMAS FOR WORKPIECE PROCESSING

PRIORITY CLAIM

The present application claims priority to and is a continuation of U.S. application Ser. No. 17/827,198, titled "Enhanced Ignition in Inductively Coupled Plasmas For Workpiece Processing," filed on May 27, 2022, which is a divisional of U.S. application Ser. No. 16/547,724, titled "Enhanced Ignition in Inductively Coupled Plasmas For Workpiece Processing," filed on Aug. 22, 2019, which is a continuation in part application of U.S. application Ser. No. 16/537,748, titled "Enhanced Ignition in Inductively Coupled Plasmas for Workpiece Processing," filed on Aug. 12, 2019, which is incorporated herein by reference.

FIELD

The present disclosure relates generally to plasma processing using a plasma source.

BACKGROUND

Plasma processing tools can be used in the manufacture of devices such as integrated circuits, micromechanical devices, flat panel displays, and other devices. Plasma processing tools used in modern plasma etch applications are required to provide a high plasma uniformity and a plurality of plasma controls, including independent plasma profile, plasma density, and ion energy controls. Plasma processing tools can, in some cases, be required to sustain a stable plasma in a variety of process gases and under a variety of different conditions (e.g., gas flow, gas pressure, etc.).

SUMMARY

Aspects and advantages of the invention will be set forth in part in the following description, or may be obvious from the description, or may be learned through practice of the invention.

One example aspect of the present disclosure is directed to a plasma processing apparatus. The plasma processing apparatus includes a plasma chamber. The plasma processing apparatus includes a dielectric wall forming at least a portion of the plasma chamber. The plasma processing apparatus includes an inductive coupling element located proximate the dielectric wall. The plasma processing apparatus includes an ultraviolet light source configured to emit an ultraviolet light beam onto a metal surface that faces an interior volume of the plasma chamber. The plasma processing apparatus includes a controller configured to control the ultraviolet light source.

Variations and modifications can be made to example embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure to one of ordinary skill in the art is set forth more particularly in the remainder of the specification, including reference to the accompanying figures, in which.

DETAILED DESCRIPTION

Figure 1:
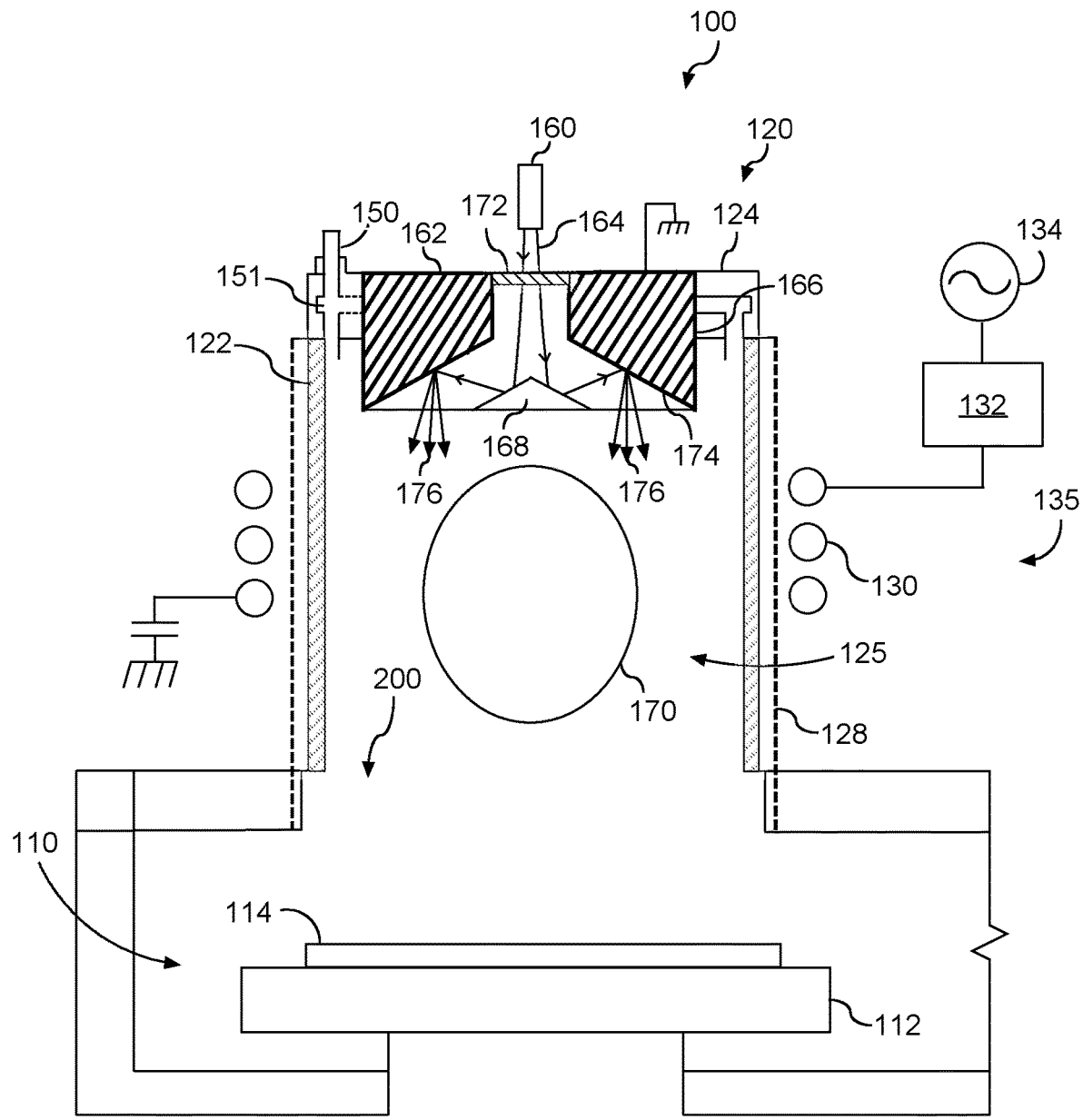
FIG. 1 depicts an example plasma processing apparatus according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to plasma processing apparatus and associated methods for enhancing ignition of inductively coupled plasmas, and in some embodiments electrostatically shielded inductively coupled plasmas. Ignition of inductively coupled plasma (also referred to as inductively coupled plasma striking) can be improved with an ultraviolet light source that emits an ultraviolet light beam onto a dielectric wall and/or a metal surface at a location proximate the plasma prior to or during ignition of the plasma (e.g., from a location outside of the plasma chamber). As such, less RF power can be used to ignite (also referred to as strike) the plasma in less time, with better igniting repeatability and reducing ion bombardment of a dielectric window.

In some example plasma sources, inductive plasma sources with reduced capacitive coupling (e.g., due to electrostatic shielding) can have substantial advantages over other inductive sources that are common in semiconductor processing. Such plasma sources with reduced capacitive coupling can have: (1) reduced ion bombardment and sputtering of interior dielectric and metal walls of the plasma source; (2) reduced plasma potential and improved ion optics for extraction; (3) increased lifetime of source components and improved cleanliness due to reduced wear and roughening of inner surfaces. Conventional plasma sources with reduced capacitive coupling (due to electrostatic shielding, RF frequency or coil configuration) can have intermittent and/or slow ignition of the plasma due to a reduced electric field in a plasma chamber (also referred to as a plasma vessel). Conventional plasma sources can use much higher radio frequency (RF) power and coil voltage to achieve reliable plasma ignition, particularly when higher gas pressures such as above about 500 mTorr are used. However, higher RF power, higher coil voltage and/or higher gas pressures cannot always yield reliable ignition, and can often have detrimental side effects such as arcing and localized sputtering of dielectric walls.

In some example plasma sources, a smaller supplemental electrode can be used in a processing chamber of a conventional plasma processing apparatus providing RF power until ignition is achieved. However, such ignition approaches can cause sputtering of the electrode or wall adjacent the electrode resulting in contamination and/or surface roughening that can lead to particle contamination.

According to example aspects of the present disclosure, an ultraviolet light source can be operated to illuminate an inner wall of a plasma chamber such that a larger number (e.g., greater than about $10^4$) of free electrons can be ejected from the illuminated wall into a gas in the plasma chamber to substantially enhance a rate of initial exponential growth of the plasma with the substantially inductive coupling of the plasma source. The ultraviolet light source can be used to reduce and make more consistent ignition time of the plasma, even at reduced RF power levels. Thus, for inductively coupled plasma sources (e.g., induction coil or antenna) with reduced capacitive coupling (e.g. due to presence of electrostatic shield or other feature), ignition enhancement can be provided using an ultraviolet light source in a plasma chamber.

In some embodiments, one or more ultraviolet light sources (e.g., a lamp or lamps) can be mounted external to a plasma chamber for an inductively coupled plasma source such that the radiation from the ultraviolet light source(s) can illuminate an inner wall (e.g., dielectric wall and/or metal wall) of the plasma chamber. The wall can have direct line of sight to the plasma chamber. For instance, there are no structures blocking a path (e.g., line of sight path) between the wall and an interior of the plasma chamber where the plasma is generated.

The ultraviolet light source(s) can have substantial portion of its output (e.g., ultraviolet light beam) as electromagnetic radiation (EM) radiation below about 250 nanometers (nm) wavelength, down to about 100 nm wavelength.

In some embodiments, an electrostatic shield can be located between a dielectric wall, which forms at least a portion of the plasma chamber and the inductively coupled plasma source. In some embodiments, the ultraviolet light source(s) can be located adjacent a window such that one or more ultraviolet light beams from the ultraviolet light source(s) can pass through the window to reach an inner wall of the plasma chamber. For instance, the window can have at least one of: synthetic quartz, UV-grade sapphire, magnesium fluoride ($MgF_2$) material, or calcium fluoride ($CaF_2$) material. A space between the ultraviolet light source(s) and the window can be filled with an inert gas to reduce absorption by atmospheric oxygen. The inert gas can include at least one of: helium, neon, argon and/or nitrogen.

In some embodiments, the ultraviolet light source(s) can be operated in a pulsed mode or turned on just before or during initiation of RF power introduction to an inductively coupled plasma source. Radiation from the ultraviolet light source(s) can be maintained at least until the plasma attains some minimal fraction of its ultimate density. In some embodiments, the radiation can be aimed at one or more interior wall areas that are proximate to an exterior inductively coupling element.

According to example aspects of the present disclosure, an inductive plasma source of the type having superior suitability for ultra-clean semiconductor processing can include low wall sputter and low plasma contamination. The disclosed inductive plasma source can substantially improve reliability and speed of plasma ignition while also having superior cleanliness. For instance, a plasma processing apparatus can include a plasma chamber (e.g., an evacuated vessel), a dielectric wall forming at least a portion of the plasma chamber, and an inductive coupling element (e.g., an inductive coupled plasma source, such as an induction coil or an antenna) located proximate the dielectric wall. The inductive coupling element can be connected to a supply of RF power. The plasma processing apparatus can further include a controllable supply of process gas to the plasma chamber interior, and a separately controllable source of ultraviolet radiation (e.g., one or more ultraviolet light beams).

In some embodiments, a plasma processing apparatus can be configured such that a substantial fraction of an ultraviolet radiation from an ultraviolet source can have a line of sight through an at least partially ultraviolet-transparent window in a plasma chamber. The ultraviolet radiation can intercept at least a portion of an interior surface of the plasma chamber such that the ultraviolet radiation can be absorbed on surfaces adjacent plasma when in operation (e.g., in a plasma region). In some embodiments, the ultraviolet light source can have instantaneous power of several Watts or more of radiation emission during operation of which at least 1% and preferably 10% or more is in a hard-ultraviolet band, e.g., in a wavelength range of about 100 nanometers to about 350 nanometers, such as a wavelength range of about 180 nanometers to about 250 nanometers. The ultraviolet light source can be a lamp that is separate and isolated from an inductive coupling element. In some embodiments the ultraviolet light source can employ a gas or gases that produce radiation in the hard-ultraviolet band (Wavelength less than about 250 nm). The ultraviolet light source can be turned on or the ultraviolet light source can start pulsing to illuminate a part of an interior surface of the plasma chamber, prior to or simultaneous with a turning-on of RF power to ignite a plasma in the plasma chamber. As such, reliability of ignition and growth of the plasma can be accelerated and improved.

In some embodiments, the inductive coupling element (e.g., an antenna for inductive coupling of RF power to plasma) can have reduced capacitive coupling to dielectric walls of the plasma chamber, and to plasma during operation. In some embodiments, the inductive coupling element can be separated by a substantial physical gap from a dielectric portion (e.g., a dielectric wall) of the plasma chamber such that capacitive coupling of the inductive coupling element to plasma can be reduced. In some embodiments, the inductive coupling element can be located at a distance greater than a radius of the inductive coil. In some embodiments, those part(s) of the inductive coupling element that are physically closest to the dielectric portion of the plasma chamber can be grounded, or connected through a tunable reactance that can have low impedance (e.g., less than about 5 Ohms) to electrical ground.

In some embodiments, the plasma processing apparatus can further include one or more pieces of conducting material that can be interposed partially or fully between the inductive coupling element and the dielectric portion of the plasma chamber. The one or more pieces of conducting material can be connected electrically, either directly or through a tunable circuit, to ground thereby forming electrostatic shielding that mitigates capacitive coupling of the inductive coupling element to the plasma. As such, plasma potential can be reduced and energy of ions bombarding the plasma chamber wall can be reduced.

In some example conventional plasma processing apparatus, capacitive coupling of an inductive coupling element to plasma can be sufficiently weak so that normal plasma ignition can become unreliable or require too much time, e.g., during which electrical stresses are often large in RF power components and electric fields large near the inductive coupling element. This slow ignition can be generally the case because inductive discharges generally start in the "E" mode where capacitive coupling initiates the breakdown and then transitions to the "H" mode wherein the inductive coupling takes over sustaining the plasma as it provides the majority of power for electrons doing ionization. In conventional inductive plasma processing apparatus, capacitive electric fields can be larger but more localized than the inductive electric fields.

According to example aspects of the present disclosure, the plasma processing apparatus can have various features for mitigation of capacitive coupling from the inductive coupling element to the plasma, while successfully igniting plasmas rapidly and consistently without employing much higher RF current and RF power levels to the inductive coupling element than those employed for the conventional plasma processing apparatus in steady state operation. In some embodiments, ultraviolet radiation from the ultraviolet light source can promote plasma ignition and growth by ejecting photo-electrons from an irradiated surface(s) into dilute gas proximate what will be a plasma region (once ignited) as RF power is applied to the inductive coupling element. These electrons can then be accelerated by electrical fields in the plasma region to cause ionization of the gas in the plasma chamber. The ionization can then provide additional electrons that take part in "avalanche" of ionization which forms the plasma. In some embodiments, a plasma-facing surface irradiated with the ultraviolet radiation can be a part of a dielectric or metal wall of the plasma chamber. The dielectric or metal wall can have substantial induction electric fields when RF power is being provided. In some embodiments, the ultraviolet irradiated surface can be a metal surface on an interior of the plasma chamber that has a line of sight to the plasma region.

In some embodiments, metal surfaces that are not electrically floating (e.g., are electrically grounded) are desired since they do not charge up so as to prevent electron emission as electrons are ejected from the surface. Further, the energy required for electron photo-emission is less in conducting materials than in insulating materials since conduction band electrons require less energy to be ejected than valence band electrons from solids. Further, metal walls do not charge-up resulting in trapping of emitted electrons as insulating materials can do.

In some embodiments, ultraviolet light sources for promotion of plasma ignition can have total instantaneous radiation output of about 1 Watt or more with output emission spectrum having at least 5% of power in the hard-ultraviolet band (e.g., in a wavelength range less about 250 nanometers). Examples of such ultraviolet light sources can include Xenon flashlamps, Deuterium lamps, excimer lamps or other any suitable light sources that meet the above features. In some embodiments, a window in the plasma chamber can be made of material transmissive of hard-ultraviolet radiation. The window can have at least one of synthetic quartz, UV-grade Sapphire, or more highly UV transmissive materials such as $MgF_2$ or $CaF_2$. In some embodiments, the window can be a vacuum window with atmospheric pressure gas around the ultraviolet light source. For instance, a space between the ultraviolet light source and the window can be filled with an inert gas (e.g., helium, argon, neon, and/or nitrogen) to reduce absorption by atmospheric oxygen.

In some embodiments, the hard-ultraviolet band of the ultraviolet light source can include a wavelength range that between about 115 nanometers and about 180 nm. This band can be referred to as "Vacuum Ultraviolet" (VUV), since these wavelengths are strongly absorbed by oxygen, such as in oxygen in air. In some embodiments, the ultraviolet radiation can have 10% or more its electromagnetic radiation output in a VUV part of a spectrum of the ultraviolet light source. The instantaneous output power in the hard-UV band at the time of plasma ignition can be about 0.1 Watt or more. This photon energy can be helpful because the photoemission of an electron from an insulator requires such photon energy that it can raise a valence electron past the conduction band and into the free electron energy space. For photoemission from metal, photon energy from the ultraviolet light source can raise an electron from a conduction band to a free state. In some embodiments, the photoelectron emission from the interior surface of the plasma chamber can include at least 100 electrons. To reduce heat buildup in an ultraviolet light source(s) (e.g., lamp), the ultraviolet light source can be pulsed with multiple very short pulses at short intervals (e.g., less than about 100 milliseconds and preferably less than 10 milliseconds). The ultraviolet light source can start pulsing prior to or just following the time of initiation of RF power supplied to the inductive coupling element. In some embodiments, the ultraviolet radiation pulses can have a frequency of at least about 100 per second so that a UV radiation pulse will occur within about 10 milliseconds after the electric field strength is capable of initiating breakdown thereby reducing the total time at high level RF power for the ignition process.

In some embodiments, the ultraviolet light source can be a xenon arc flashlamp with an ultraviolet window or a VUV window that produces ultraviolet light in the hard-ultraviolet band or in the VUV band. In some embodiments, the xenon arc flashlamp can be small (e.g., less than or about 1 inch for all dimensions). In some embodiments, the xenon arc flashlamp can be a high-pressure arc lamp that can pulse up to about 300 Hertz (Hz) and operate at an average power level less than about 10 Watts. In some embodiments, an arc lamp can produce strong continuum radiation down to about 100 nanometers in wavelength. In some embodiments such a small flashlamp might be positioned within the volume where the gas pressure is low and the plasma would otherwise occupy. Such a small flashlamp might be "plugged-in" within the plasma chamber, in some embodiments in a recessed volume embedded into a metal or dielectric structure. The arc lamp can have pulse energy about 100 millijoules (mJ) to produce at least about $10^{15}$ hard-ultraviolet photons per pulse with the photoelectron efficiency of at least about 1% producing orders of magnitude of more photoelectrons than needed.

In some embodiments, the ultraviolet light source can be a deuterium VUV lamp with $MgF_2$ window. The deuterium VUV lamp can be a high-pressure deuterium arc lamp with radiation substantially in a band at about 160 nanometers. The high-pressure deuterium arc lamp can be a continuous wave (CW) VUV source, not pulsed. In some embodiments, there is an about 25 seconds warm-up time for these lamps, so it is important to turn the deuterium VUV lamp on about 10 seconds to 30 seconds before ignition is desired and off in synchrony with plasma reaching a full power. Provision should be made for cooling such a lamp since continuous operation produces substantial heat. Life of such lamp can be at least about 1000 hours, which can be adequate for about 100,000 ignitions, which can be adequate for at least about 2 months of 24×7 process operation.

In some embodiments, the ultraviolet light source can be an excimer RF/pulse xenon lamp. For instance, the excimer xenon lamp can be a highly efficient source of about 172 nanometers radiation. The excimer xenon lamp can have long lifetime (e.g., longer than about 10,000 hours).

In some embodiments, the ultraviolet light source(s) for acceleration of plasma ignition can illuminate area(s) of the inner wall of the plasma chamber through a vacuum window of the plasma chamber. The vacuum window can be at least partially transparent to ultraviolet radiation. In some embodiments, the vacuum window can be highly transmissive of ultraviolet light such as $MgF_2$, $CaF_2$ or similar materials. In some embodiments, the vacuum window can have materials such as "synthetic quartz" materials that have better UV transmission than natural or conventional quartz down to wavelengths of about 150 nm. Such window materials can have at least 20% transmission of ultraviolet light in a wavelength range of from about 115 nanometers to about 200 nanometers. In some embodiments, the ultraviolet light source can be mounted adjacent or near to the vacuum window in a vacuum wall (e.g., a dielectric part of the vacuum wall, and/or a metal part of the vacuum wall) of the plasma chamber. In some embodiments, a space between the ultraviolet light source and the vacuum window can be purged or filled with helium or nitrogen to reduce UV loss due to absorption by atmospheric oxygen.

In some embodiments, ultraviolet radiation from the ultraviolet light source can be incident on a surface on the inside of the plasma chamber. The surface in some embodiments can be adjacent a volume with substantial induction electric field such that photoelectrons can provide a substantial density in the plasma region where the gas breakdown and plasma ignition avalanche occur. In some embodiments, a threshold for plasma ignition can be lowered to about the same power density level as is used for sustaining the plasma, e.g., power density as much as about 70% less than the RF power for a normal plasma ignition threshold.

In some embodiments, the plasma processing chamber can include a smaller adjacent chamber that is separated from a plasma chamber by an ultraviolet transmissive window. For instance, such small adjacent chamber can be a sealed chamber having at least two electrodes and a high-pressure inert gas such as xenon. The window between the smaller adjacent chamber and the main plasma chamber can in part be made of a VUV transmissive material such as synthetic quartz. Ignition of plasma can be then facilitated by supplying appropriate pulsed DC power to the electrodes in the adjacent chamber such that plasma is rapidly struck in the adjacent chamber and produces copious VUV radiation that illuminates dielectric wall(s) and/or metal wall(s) of the plasma chamber through the window.

Example aspects of the present disclosure are directed to a plasma processing apparatus. The plasma processing can include a plasma chamber, a dielectric wall forming at least a portion of the plasma chamber, an inductive coupling element located proximate the dielectric wall, an ultraviolet light source (e.g., CW lamp or pulsed lamp, such as, a xenon arc flashlamp, deuterium lamp, or an excimer RF/pulse xenon lamp) to emit an ultraviolet light beam onto a metal surface or a dielectric surface in the plasma chamber. The metal surface or a dielectric surface can emit one or more electrons into the plasma chamber when the ultraviolet light beam is incident on the metal surface or a dielectric surface. The plasma processing apparatus can further include a controller to control the power to the ultraviolet light source and thereby the emission of ultraviolet light beam upon the metal surface or the dielectric surface prior to or during ignition of a plasma in a process gas by energizing the inductive coupling element with a radio frequency (RF) energy (e.g., exciting with RF energy).

In some embodiments, the controller (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on the ultraviolet light source to emit the ultraviolet light beam on the metal surface or the dielectric surface prior to or during ignition of a plasma, or other suitable operation.

In some embodiments, the plasma chamber can further include one or more reflective elements (e.g., mirrors) reflect the light beam onto the metal surface or the dielectric surface. In some embodiments, the metal surface and/or dielectric surface can be electrically grounded. In some embodiments, the ultraviolet light source can emit the light beam in a wavelength range from about 100 nanometers to about 250 nanometers. In some embodiments, the plasma processing apparatus can include an electrostatic shield (e.g., a Faraday shield, or other suitable conductive materials) located between the dielectric wall and the inductive coupling element. In some embodiments, the ultraviolet light beam can pass through a vacuum window to reach the metal surface and/or dielectric surface. The vacuum window (e.g., synthetic quartz, UV-grade sapphire, magnesium fluoride (MgF2) material, or calcium fluoride (CaF2) material) can be at least partially transparent to the ultraviolet light beam. In some embodiments, a space between the ultraviolet light source and the window can be filled with a gas (e.g., helium or nitrogen) to reduce absorption by atmospheric oxygen. In some embodiments, the plasma chamber can be separated (e.g., by a separation grid) from a processing chamber having a workpiece support configured to support a workpiece.

Example aspects of the present disclosure are directed to a method for igniting a plasma in a plasma processing apparatus. The method can include admitting a process gas into a plasma chamber. The method can include exciting an inductive coupling element to initiate ignition of the plasma in the process gas. Prior to or during excitation of the inductive coupling element for the purpose of ignition of the plasma in the process gas, the method can include emitting an ultraviolet light, via an ultraviolet light source, onto a metal surface and/or dielectric surface in the plasma chamber. The metal surface and/or dielectric surface can emit one or more electrons into the plasma chamber when the ultraviolet light beam is incident on the metal surface or a dielectric surface. The method can include energizing the inductive coupling element with a radio frequency (RF) energy to sustain the plasma in the process gas.

Aspects of the present disclosure are discussed with reference to a "workpiece" that is a "semiconductor wafer" for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value.

Example aspects of the present disclosure can provide a number of technical effects and benefits. For instance, a plasma processing apparatus can include an ultraviolet light source can be controlled to emit the ultraviolet light beam on a metal surface or on a dielectric surface prior to or during ignition of a plasma in a process gas by energizing the inductive coupling element with a radio frequency (RF) energy. As such, the plasma processing apparatus can improve ignition of plasma with a lower RF power level and can also improve speed and reliability of plasma ignition for semiconductor wafers. The plasma processing apparatus can also reduce sputtering, particle contamination, and roughening of the inner walls of the plasma chamber.

FIG. 1 depicts an example plasma processing apparatus 100 according to example embodiments of the present disclosure. As illustrated, the plasma processing apparatus 100 includes a processing chamber 110 and a plasma chamber 120 that is separated from the processing chamber 110. The processing chamber 110 includes a substrate holder or workpiece support 112 operable to hold a workpiece 114 to be processed, such as a semiconductor wafer. In this example illustration, a plasma is generated in the plasma chamber 120 (i.e., plasma generation region 170) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure. In particular, in some embodiments there need not be a separation, baffle or grid between plasma generation and substrate support volumes.

The plasma chamber 120 includes a dielectric side wall 122 and a ceiling 124. The dielectric side wall 122, the ceiling 124, and the separation grid 200 define a plasma chamber interior 125. The dielectric side wall 122 can be formed from a dielectric material, such as quartz and/or alumina. The inductively coupled plasma source 135 can include an induction coil 130 disposed adjacent to the dielectric side wall 122 above the plasma chamber 120. The induction coil 130 is coupled to an RF power generator 134 through a suitable matching network 132. Process gases (e.g., reactant and/or carrier gases) can be provided to the chamber interior from a gas supply 150 and an annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma. In some embodiments the Faraday shield need not be directly grounded but may be grounded through a tunable reactive circuit that may be tuned to a low reactive impedance.

As shown in FIG. 1, the separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

According to example aspects of the present disclosure, ignition of inductively coupled plasma can be improved with an ultraviolet light source that emits an ultraviolet light beam onto a dielectric wall and/or a metal surface at a location proximate the volume that will be occupied by plasma following ignition of the plasma. As such, less power can be used to ignite the plasma with better igniting repeatability and to reduce a direct electric field ion bombardment to a dielectric window.

As can be seen in FIG. 1, the plasma processing chamber 100 further includes an ultraviolet light source 160 and an ultraviolet (UV) emission assembly 162.

The ultraviolet light source 160 is mounted external to the plasma chamber 120 for the inductively coupled plasma source 135 such that radiation from the ultraviolet light source 160 can illuminate an inner wall of the UV emission assembly 162 prior to or during ignition of the plasma. The ultraviolet light source 160 emits one or more ultraviolet light beams 164 (e.g., in a wavelength range of about 100 nanometers to about 250 nanometers) into the plasma chamber 120 through the UV emission assembly 162. The ultraviolet light source 160 can be a CW lamp or a pulsed lamp. Examples of the ultraviolet light source 160 can include a xenon arc flashlamp, deuterium lamp, an excimer RF/pulse xenon lamp, or any other suitable light source that emits an ultraviolet light beam. For instance, the ultraviolet light source 160 can be turned on or the ultraviolet light source 160 can start pulsing to illuminate a part of an interior surface of the UV emission assembly 162, prior to or simultaneous with a turning-on of RF power 134 to ignite the plasma in the plasma chamber 120. Radiation from the ultraviolet light source 160 can be maintained at least until the plasma attains a substantial fraction of its ultimate density. As such, reliability of ignition and growth of the plasma can be accelerated and improved.

In some embodiments, to reduce heat buildup in the ultraviolet light source 160, the ultraviolet light source 160 can be pulsed with multiple rapid pulses (e.g., less than about 1 millisecond) at very short intervals (e.g., less than about 10 milliseconds). The ultraviolet light source 160 can start pulsing prior to or just following the time of initiation of RF power 134 supplied to the inductively coupled source 135. In some embodiments, the ultraviolet radiation pulses can have a frequency of at least about 10 per second and preferably 100 per second or more so that multiple pulses can contribute ultraviolet photons to an ignition process. As such, ultraviolet acceleration of plasma ignition can only take about 10 milliseconds.

In some embodiments, ultraviolet radiation from the ultraviolet light source 160 can promote plasma ignition and growth by ejecting photo-electrons from an irradiated surface(s) proximate the plasma region 170 as the RF power 134 is applied to the inductively coupled plasma source 135, as further described below. The irradiated surface may be metal or insulator material or metal with a very thin insulator surface layer.

In some embodiments (not shown in FIG. 1), the plasma processing apparatus 100 can include a controller that controls the ultraviolet light source 160 to emit the ultraviolet light beam. The controller (e.g., a computer, microcontroller (s), other control device(s), etc.) can include one or more processors and one or more memory devices. The one or more memory devices can store computer-readable instructions that when executed by the one or more processors cause the one or more processors to perform operations, such as turning on the ultraviolet light source to emit the ultraviolet light beam on a metal surface or a dielectric surface prior to or during ignition of a plasma, or other suitable operation.

The UV emission assembly 162 includes one or more walls 166, one or more reflective elements (e.g., mirrors) 168 and a vacuum window 172. The structure 162 may be electrically grounded so that the surfaces 166 and 174 are grounded. At least a portion of the wall(s) 166 can be metal, and/or dielectric. When the ultraviolet light beam 164 is incident on a surface 174 (e.g., a metal surface or a dielectric surface) at a location proximate the plasma, the surface 174 can emit one or more electrons into the plasma region 170. In some embodiments, an instantaneous output power of the ultraviolet light source 160 at the time of plasma ignition can be about 1 Watt or more. This can be because the photoemission of an electron from an insulator requires such photon energy that it can raise a valence electron past the conduction band and into the free electron energy space. For photoemission from metal, photon energy from the ultraviolet light source 160 can raise an electron from a conduction band to a free state which typically takes less photon energy. In some embodiments, the photo-electron emission from the surface 174 of the UV emission assembly 162 can include at least 1000 electrons in a pulse.

In some embodiments, electrons emitted from the surface 174 into the volume 125 can then be accelerated by electrical fields in the volume 125 to cause ionization of the gas in the plasma chamber 120. Typically, as the plasma develops and shields the plasma nearer the chamber axis of the dielectric vessel 122 the induction fields are much stronger near the inner surface of the dielectric vessel 122. The ionization can then provide additional electrons that take part in "avalanche" of ionization which forms the plasma. In some embodiments (not shown in FIG. 1), a plasma-facing surface irradiated with ultraviolet radiation can be a part of a dielectric wall of a plasma chamber, as further described in FIG. 3. The dielectric wall can have substantial induction electric fields when an RF power is being provided. In some embodiments (not shown in FIG. 1), ultraviolet irradiated surface can be a metal surface on an interior of a plasma chamber that has a line of sight to the volume within the vessel 122 that is close to the coil 130, as further described in FIG. 4.

As can be seen in FIG. 1, the ultraviolet light beam 164 is reflected onto the surface 174 via a reflective element (e.g., a mirror) 168. Electrons 176 emitted from the surface 174 pass into the plasma region 170.

The vacuum window 172 separates the UV source 160 from the reflector 168, the surface 174 and surface 166 that are exposed to the plasma chamber interior 125. The vacuum window 172 can be an ultraviolet transmissive window. For instance, the window 172 can have at least one of: synthetic quartz, UV-grade sapphire, magnesium fluoride (MgF2) material, or calcium fluoride (CaF2) material. As another example, a space between the ultraviolet light source(s) and the window can be filled with a gas (e.g., helium or nitrogen) to reduce absorption by atmospheric oxygen.

In some embodiments (not shown in FIG. 1), the UV emission assembly can be a sealed chamber having at least two electrodes and a high-pressure inert gas such as xenon. The vacuum window can in part be made of a VUV transmissive material such as synthetic quartz. Ignition of plasma can be then facilitated by supplying appropriate pulsed electric power to the electrodes in the UV emission assembly such that that the UV emission assembly experiences electric breakdown and to produce copious VUV radiation that illuminates dielectric wall(s) and/or metal wall(s) of the plasma chamber.

Figure 2:
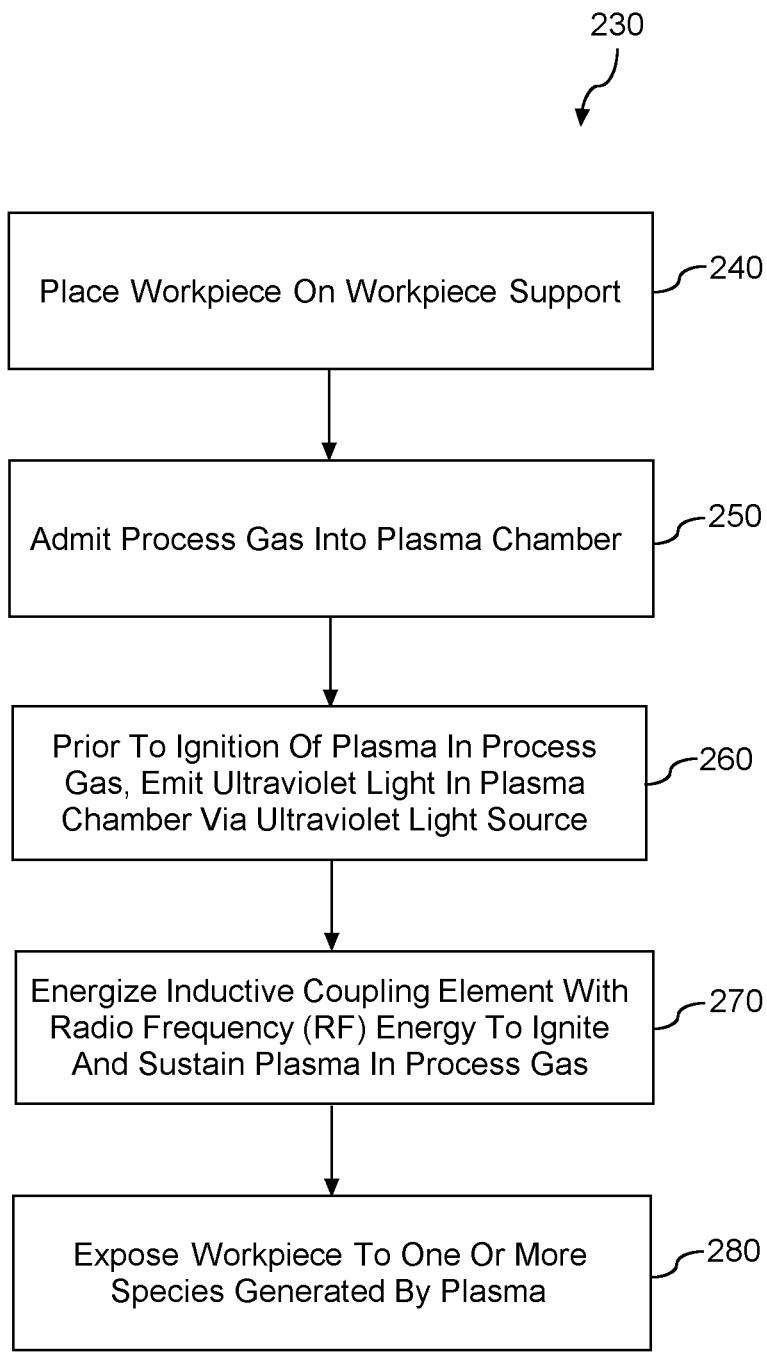
FIG. 2 depicts a flow diagram of an example method according to example embodiments of the present disclosure.

FIG. 2 depicts a flow diagram of an example method (230) for accelerating ignition of an inductively coupled plasma according to example aspects of the present disclosure. The method (230) can be implemented using the plasma processing apparatus 100. However, as will be discussed in detail below, the methods according to example aspects of the present disclosure can be implemented using other approaches without deviating from the scope of the present disclosure. FIG. 2 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (240), the method can include placing a workpiece on a workpiece support. For instance, a workpiece 114 can be placed on a workpiece support 112 in a processing chamber 110.

At (250), the method can include admitting a process gas into a plasma chamber. For instance, a process gas can be admitted into the plasma chamber interior 125 from the gas source 150 via the annular gas distribution channel 151 or other suitable gas introduction mechanism.

At (260), prior to or during initiation of providing RF power to the induction coil, the method can include emitting an ultraviolet light beam, via an ultraviolet light source, onto a metal surface and/or dielectric surface in the plasma chamber. The metal surface and/or dielectric surface can emit one or more electrons into the plasma chamber when the ultraviolet light beam is incident on the metal surface and/or dielectric surface. For instance, prior to or during ignition of the plasma in the process gas, an ultraviolet light source 160 can emit an ultraviolet light beam 164 that passes through a transmissive vacuum window and is reflected onto a surface 174 via a reflective element (e.g., a mirror) 168. Electrons 176 emitted from the surface 174 pass directly into the plasma region 170 because the surface 174 has direct line of sight to the plasma region 170 and plasma chamber interior 125.

At (270), the method can include energizing or continuing to energize the inductive coupling element with a radio frequency (RF) energy to sustain the plasma in the process gas. For instance, the induction coil 130 can be energized with the RF power generator 134 to sustain the plasma in the process gas.

At (280), the method can include exposing the workpiece to one or more species generated by the plasma. For instance, one or species generated by the plasma can be channeled from the plasma chamber 120 to surface of the workpiece 114 through the separation grid assembly 200.

Figure 3:
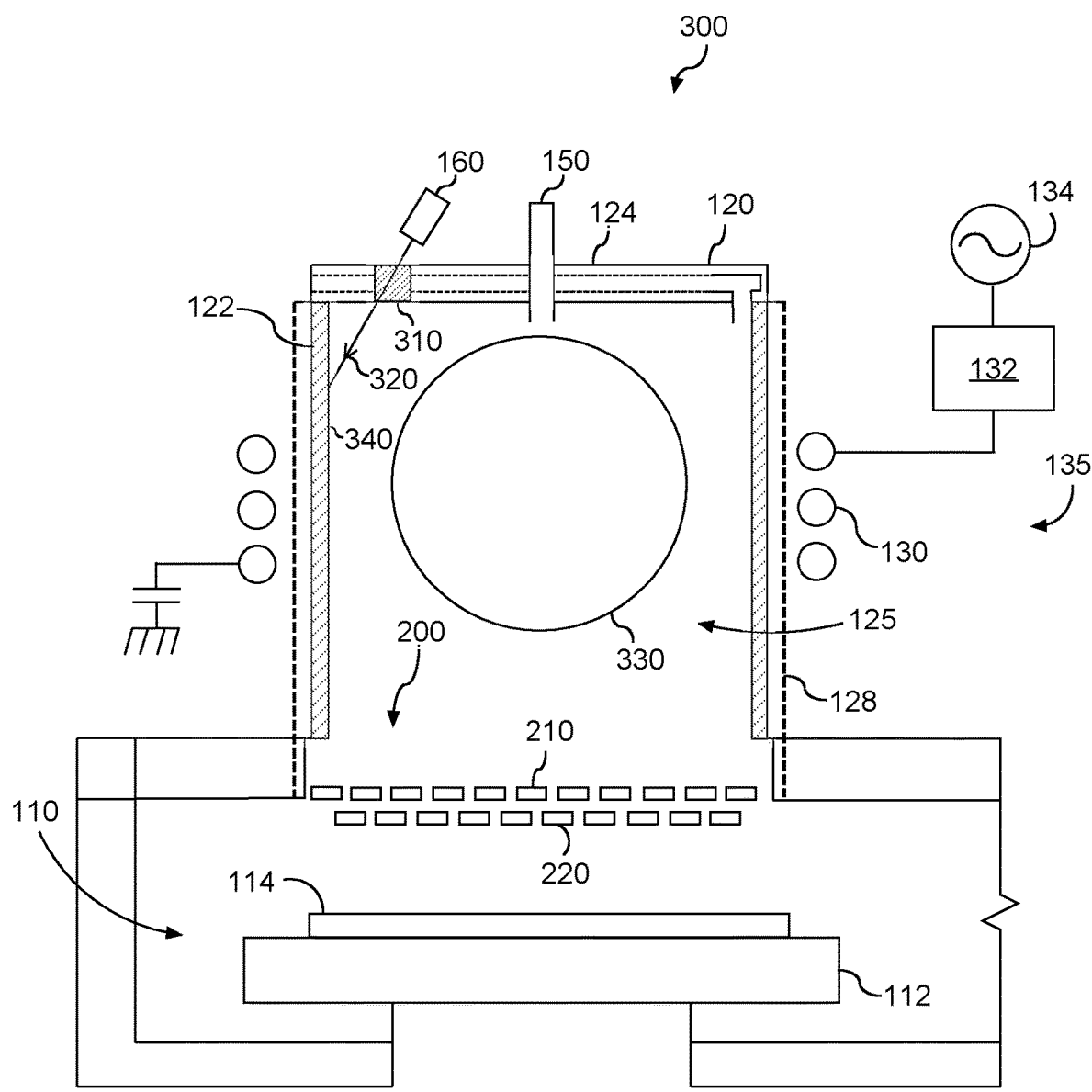
FIG. 3 depicts an example plasma processing apparatus according to example embodiments of the present disclosure.

FIG. 3 depicts an example plasma processing apparatus 300 according to example embodiments of the present disclosure. The plasma processing apparatus 300 is similar to the plasma processing apparatus 100 of FIG. 1.

More particularly, plasma processing apparatus 300 includes a processing chamber 110 and a plasma chamber 120 that is separated from the processing chamber 110. Processing chamber 110 includes a substrate holder or workpiece support 112 operable to hold a workpiece 114 to be processed, such as a semiconductor wafer. In this example illustration, a plasma is generated in plasma chamber 120 (i.e., plasma generation region 330) by an inductively coupled plasma source 135 and desired species are channeled from the plasma chamber 120 to the surface of substrate 114 through a separation grid assembly 200. In some embodiments, there is no separation grid or other structure between the plasma chamber 120 and the processing chamber 110.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent to the dielectric side wall 122 above the processing chamber 120. The induction coil 130 is coupled to an RF power generator 134 through a suitable matching network 132. Process gases (e.g., an inert gas) can be provided to the chamber interior from gas supply 150 or other suitable gas introduction mechanism. When the induction coil 130 is energized with RF power from the RF power generator 134, a plasma can be generated in the plasma chamber 120. In a particular embodiment, the plasma processing apparatus 500 can include an optional grounded Faraday shield 128 to reduce capacitive coupling of the induction coil 130 to the plasma.

According to example aspects of the present disclosure, ultraviolet light source(s) can be located adjacent a window such that one or more ultraviolet light beams from the ultraviolet light source(s) can pass through the window to reach an inner wall of a plasma chamber. For instance, as can be seen in FIG. 3, the plasma processing chamber 300 further includes an ultraviolet light source 160 and a vacuum window 310.

The ultraviolet light source 160 is mounted adjacent the vacuum window 310 such that an ultraviolet light beam 320 from the ultraviolet light source 160 passes through the window 310 to reach an interior surface 340 of the dielectric wall 122 of the plasma chamber 120. The interior surface 340 is proximate a plasma region 330 (or a plasma in the plasma region 330). As can be seen in FIG. 3, the ultraviolet light beam 320 intercepts a portion of the interior surface 340 of the plasma chamber 120 such that the ultraviolet light beam 320 is incident upon the interior surface 340 at a location adjacent plasma in operation.

The ultraviolet light source 160 can be a CW lamp or a pulsed lamp. Examples of the ultraviolet light source 160 can include a xenon arc flashlamp, deuterium lamp, an excimer RF/pulse xenon lamp, or any other suitable light source that emits an ultraviolet light beam. For instance, the ultraviolet light source 160 can be turned on or the ultraviolet light source 160 can start pulsing to illuminate a part of the interior surface 340 of the dielectric wall 122, prior to or simultaneous with a turning-on of RF power 134 to ignite the plasma in the plasma chamber 120. Radiation from the ultraviolet light source 160 can be maintained at least until the plasma attains a fraction of its ultimate density. As such, reliability of ignition and growth of the plasma can be accelerated and improved.

In some embodiments, to reduce heat buildup in the ultraviolet light source 160, the ultraviolet light source 160 can be pulsed with multiple rapid pulses at very short intervals (e.g., less than 10 milliseconds). The ultraviolet light source 160 can start pulsing prior to or just following the time of initiation of RF power 134 supplied to the inductively coupled source 135. In some embodiments, the ultraviolet radiation pulses can have a frequency of at least about 100 and in some embodiments 500 per second so that multiple pulses can contribute ultraviolet photons to an ignition process. As such, ultraviolet acceleration can only take about 10 milliseconds.

In some embodiments, ultraviolet radiation from the ultraviolet light source 160 can promote plasma ignition and growth by ejecting electrons from an irradiated surface(s) proximate the plasma as the RF power 134 is applied to the inductively coupled plasma source 135. When the ultraviolet light beam 320 is incident on the interior surface 340 (e.g., a dielectric surface) at a location proximate the plasma, the surface 340 can emit one or more electrons into the plasma region 330. In some embodiments, an instantaneous output power of the ultraviolet light source 160 at the time of plasma ignition can be about 1 Watt or more. This can be because the photo-emission of an electron from an insulator requires such photon energy that it can raise a valence electron past the conduction band and into the free electron energy space. In some embodiments, the photo-electron emission from the surface 340 can include at least 5000 electrons. In some embodiments, electrons emitted from the surface 340 can then be accelerated by electrical fields in the plasma region 330 to cause ionization of the gas in the plasma chamber 120. The ionization can then provide additional electrons that take part in "avalanche" of ionization which forms the plasma. In some embodiments there may be a thin metal coating on the dielectric wall that may intercept the UV radiation from the source 160.

In some embodiments (not shown in FIG. 3), the plasma processing apparatus 300 can include a controller that controls the ultraviolet light source 160 to emit the ultraviolet light beam 320. The controller (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on the ultraviolet light source to emit the ultraviolet light beam on a dielectric surface prior to or during ignition of a plasma, or other suitable operation.

The vacuum window 310 can be one example embodiment of the vacuum window 172. For instance, the window 310 can have at least one of: synthetic quartz, UV-grade sapphire, magnesium fluoride (MgF2) material, or calcium fluoride (CaF2) material. As another example, a space between the ultraviolet light source 160 and the window 310 can be filled with a gas (e.g., helium, nitrogen, argon, and/or nitrogen) to reduce absorption by atmospheric oxygen.

Figure 4:
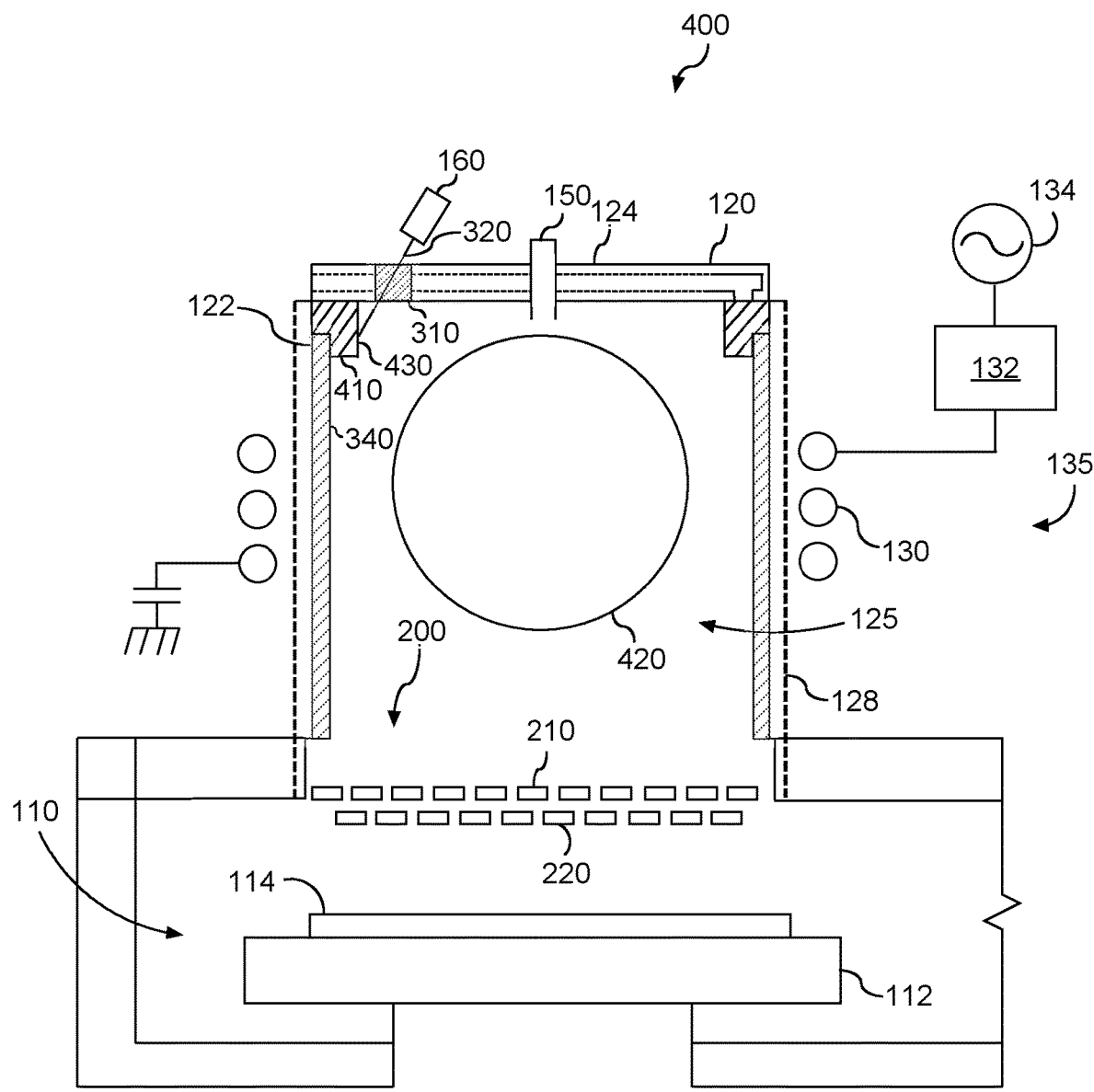
FIG. 4 depicts an example plasma processing apparatus according to example embodiments of the present disclosure.

FIG. 4 depicts an example plasma processing apparatus 400 according to example embodiments of the present disclosure. The plasma processing apparatus 400 is similar to the plasma processing apparatus 100 of FIG. 1 and the plasma processing apparatus 300 of FIG. 3.

More particularly, plasma processing apparatus 400 includes a processing chamber 110 and a plasma chamber 120 that is separated from the processing chamber 110. Processing chamber 110 includes a substrate holder or workpiece support 112 operable to hold a workpiece 114 to be processed, such as a semiconductor wafer. In this example illustration, a plasma is generated in plasma chamber 120 (i.e., plasma generation region 420) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz, glass, alumina, silicon nitride, silicon oxynitride, aluminum nitride, aluminum oxynitride, or other high-temperature capable dielectric or combination thereof. The inductively coupled plasma source 135 can include an induction coil 130 disposed adjacent to the dielectric side wall 122 above the plasma chamber 120. The induction coil 130 is coupled to an RF power generator 134 through a suitable matching network 132. Process gases (e.g., an inert gas) can be provided to the chamber interior from gas supply 150 or other suitable gas introduction mechanism. When the induction coil 130 is energized with RF power from the RF power generator 134, a plasma can be generated in the plasma chamber 120. In a particular embodiment, the plasma processing apparatus 500 can include an optional grounded Faraday shield 128 to reduce capacitive coupling of the induction coil 130 to the plasma.

As shown in FIG. 4, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

According to example aspects of the present disclosure, ultraviolet light source(s) can be located adjacent a window such that one or more ultraviolet light beams from the ultraviolet light source(s) can pass through the window to impinge on a metal surface 430 that may be of a metal structure 410 of a plasma chamber (e.g., a top cap). As can be seen in FIG. 4, the plasma processing chamber 400 further includes an ultraviolet light source 160, a vacuum window 310 and a metal wall 410. The ultraviolet light source 160 is mounted adjacent the vacuum window 310 such that an ultraviolet light beam 320 from the ultraviolet light source 160 passes through the window 310 to reach an interior surface 430 of the metal wall 410 of the plasma chamber 120. The interior surface 430 is proximate a plasma region 420 (or a plasma in the plasma region 420). As can be seen in FIG. 4, the ultraviolet light beam 320 intercepts a portion of the interior surface 410 of the plasma chamber 120 such that the ultraviolet light beam 320 can pass through some part of the volume that may be occupied by plasma in operation and can also pass through some part of the evacuated volume that may not be occupied by plasma in operation.

The ultraviolet light source 160 can be a CW lamp or a pulsed lamp. Examples of the ultraviolet light source 160 can include a xenon arc flashlamp, deuterium lamp, an excimer RF/pulse xenon lamp, or any other suitable light source that emits an ultraviolet light beam. For instance, the ultraviolet light source 160 can be turned on or the ultraviolet light source 160 can start pulsing to illuminate a part of the interior surface 430 of the metal wall 410, prior to or simultaneous with a turning-on of RF power 134 to ignite the plasma in the plasma chamber 120. Radiation from the ultraviolet light source 160 can be maintained at least until the plasma attains a fraction of its ultimate density. As such, reliability of ignition and growth of the plasma can be accelerated and improved.

In some embodiments, to reduce heat buildup in the ultraviolet light source 160, the ultraviolet light source 160 can be pulsed with multiple rapid pulses at very short intervals (e.g., less than 50 milliseconds and more preferably less than 10 milliseconds). The ultraviolet light source 160 can start pulsing prior to or just following the time of initiation of RF power 134 supplied to the inductively coupled source 135. In some embodiments, the ultraviolet radiation pulses can have a frequency of at least about 500 per second so that multiple pulses can contribute ultraviolet photons to an ignition process. As such, the total duration of ultraviolet acceleration of plasma ignition can only take about 50 milliseconds and preferably less than 10 milliseconds.

In some embodiments, ultraviolet radiation from the ultraviolet light source 160 can promote plasma ignition and growth by ejecting electrons from an irradiated surface(s) proximate the volume that will be occupied by plasma as the RF power 134 is applied to the inductively coupled plasma source 135. When the ultraviolet light beam 320 is incident on the interior surface 430 (e.g., a metal surface) at a location proximate where the plasma will be, the surface 430 can emit one or more electrons into the region 420 that the plasma will occupy. In some embodiments, an instantaneous output power of the ultraviolet light source 160 at the time of plasma ignition can be about 1 Watt or more, preferably a fraction larger than 10% of which is in the hard UV band. This can be because the photo-emission of an electron from an insulator requires such photon energy that it can raise a valence electron past the conduction band and into the free electron energy space. In some embodiments, in one pulse of UV the photo-electron emission from the surface 430 can include at least 1000 electrons.

In some embodiments, electrons emitted from the surface 430 can then be accelerated by electrical fields in the region 420 induced by the rf current in the induction coil to cause ionization of the gas in the plasma chamber 120 to fill the region 420 with plasma. The ionization of gas in this region can then provide additional electrons that take part in "avalanche" of ionization which forms the plasma.

In some embodiments (not shown in FIG. 4), the plasma processing apparatus 400 can include a controller that controls the ultraviolet light source 160 to emit the ultraviolet light beam 320. The controller (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on the ultraviolet light source to emit the ultraviolet light beam on a metal surface prior to or during ignition of a plasma, or other suitable operation.

The vacuum window 310 can be one embodiment of the vacuum window 172. For instance, the window 310 can have at least one of: synthetic quartz, UV-grade sapphire, magnesium fluoride (MgF2) material, or calcium fluoride (CaF2) material. As another example, a space between the ultraviolet light source 160 and the window 310 can be filled with a gas (e.g., helium or nitrogen) to reduce absorption by atmospheric oxygen.

Figure 5:
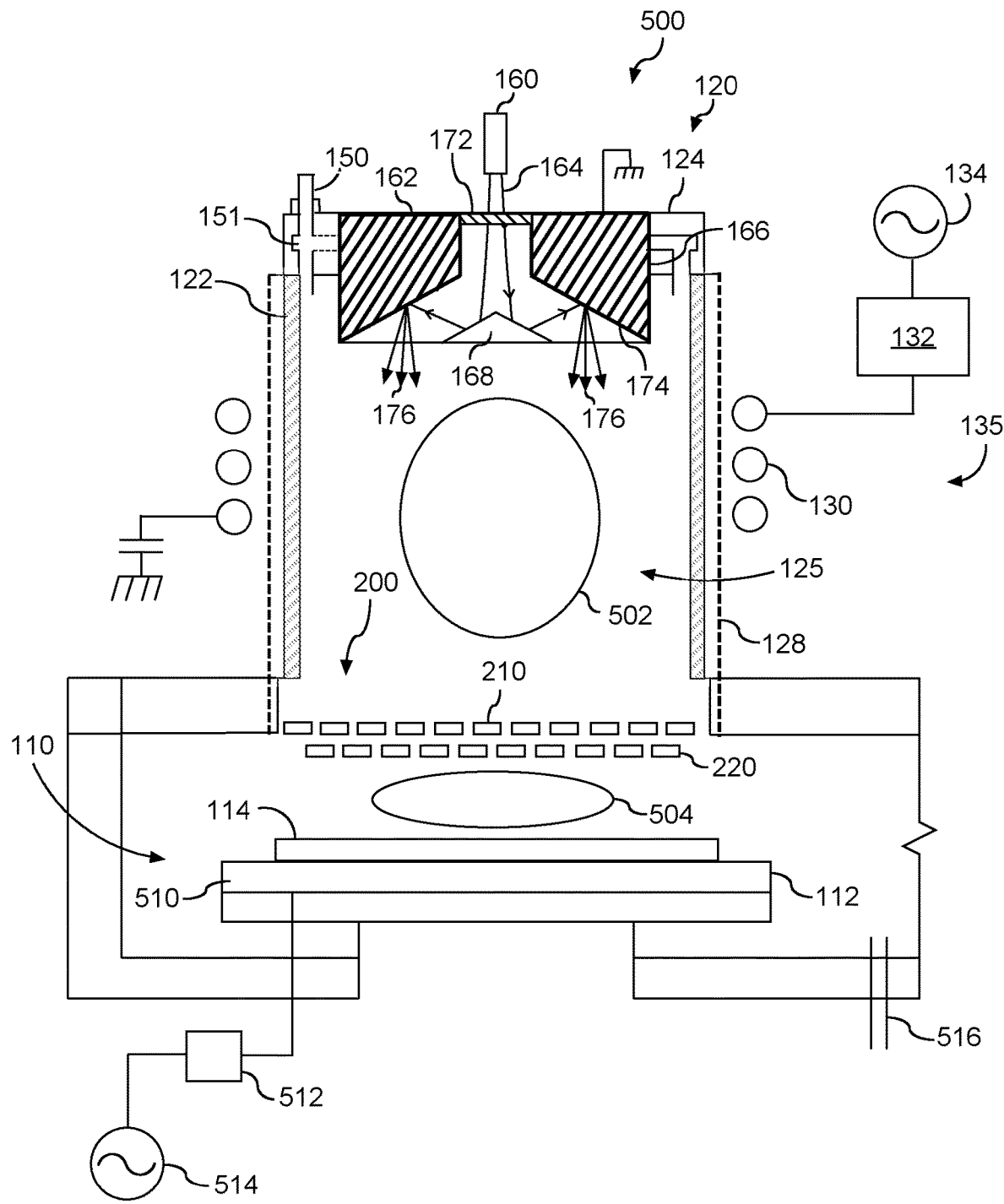
FIG. 5 depicts an example plasma processing apparatus according to example embodiments of the present disclosure.

FIG. 5 depicts an example plasma processing apparatus 500 according to example embodiments of the present disclosure. The plasma processing apparatus 500 is similar to the plasma processing apparatus 100 of FIG. 1.

More particularly, plasma processing apparatus 500 includes a processing chamber 110 and a plasma chamber 120 that is separated from the processing chamber 110. Processing chamber 110 includes a substrate holder or workpiece support 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina or other high temperature resistant dielectrics such as ceramics. The inductively coupled plasma source 135 can include an induction coil 130 disposed adjacent to the dielectric side wall 122 above the plasma chamber 120. The induction coil 130 is coupled to an RF power generator 134 through a suitable matching network 132. Process gases can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 500 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

The example plasma processing apparatus 500 of FIG. 5 is operable to generate a first plasma 502 (e.g., a remote plasma) in the plasma chamber 120 and a second plasma 504 (e.g., a direct plasma) in the processing chamber 110. As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a workpiece support operable to support the workpiece.

More particularly, the plasma processing apparatus 500 of FIG. 5 includes a bias source having bias electrode 510 in the workpiece support 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110.

According to example aspects of the present disclosure, ignition of inductively coupled plasma can be improved with an ultraviolet light source that emits an ultraviolet light beam onto a dielectric wall and/or a metal surface at a location proximate to where the plasma will be, prior to or during ignition of the plasma. As such, less power can be used to ignite either or both of the plasmas with better igniting repeatability and to reduce a direct electric field ion bombardment to a dielectric window.

As can be seen in FIG. 5, the plasma processing chamber 500 further includes an ultraviolet light source 160 and a metal top structure 162 containing a UV transmissive window 172. The ultraviolet light source 160 is mounted external to the plasma chamber 120 for the inductively coupled plasma source 135 such that radiation from the ultraviolet light source 160 can illuminate an inner wall of the metal top structure 162 prior to or during ignition of the plasma. The ultraviolet light source 160 emits one or more ultraviolet light beams 164 into the plasma chamber 120 through the UV transmissive window 172. The ultraviolet light source 160 can be a CW lamp or a pulsed lamp. Examples of the ultraviolet light source 160 can include a xenon arc flashlamp, deuterium lamp, an excimer RF/pulse xenon lamp, or any other suitable light source that emits an ultraviolet light beam. For instance, the ultraviolet light source 160 can be turned on or the ultraviolet light source 160 can start pulsing UV energy that is then transmitted through window 172 to illuminate a part of an interior surface of the metal top structure 162, that faces the interior of the plasma chamber, prior to or simultaneous with a turning-on of RF power 134 to ignite the plasma in the plasma chamber 120. Radiation from the ultraviolet light source 160 can be maintained at least until the plasma attains a fraction of its ultimate density or the voltage on the inductive coupling antenna exhibits a substantial and rapid change as the plasma occupies a portion of the interior of the chamber. As such, reliability of ignition and growth of the plasma can be accelerated and improved.

In some embodiments, to reduce heat buildup in the ultraviolet light source 160, the ultraviolet light source 160 can be pulsed with multiple rapid pulses at very short intervals (e.g., less than 10 milliseconds). The ultraviolet light source 160 can start pulsing prior to or just following initiation of RF power 134 supplied to the inductively coupled source 135. In some embodiments, the ultraviolet radiation pulses can have a frequency of at least about 100 per second so that multiple pulses can contribute ultraviolet photons to an ignition process. As such, ultraviolet-assisted ignition of the plasma can only take about 50 milliseconds or less.

In some embodiments, ultraviolet radiation from the ultraviolet light source 160 can promote plasma ignition and growth by ejecting photo-electrons from an irradiated surface(s) proximate the region 502 that will contain plasma as the RF power 134 is applied to the inductively coupled plasma source 135, as further described below.

In some embodiments (not shown in FIG. 5), the plasma processing apparatus 500 can include a controller that controls the ultraviolet light source 160 to emit the ultraviolet light beam. The controller (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on the ultraviolet light source to emit the ultraviolet light beam on a metal surface or a dielectric surface prior to or during ignition of a plasma, or other suitable operation.

The metal top structure 162 includes one or more walls 166, one or more reflective elements (e.g., mirrors) 168 and a vacuum window 172. The structure 162 is electrically grounded or may be biased negatively with respect to earth ground, particularly during the plasma ignition phase. At least a portion of the wall(s) 166 can be metal, and/or dielectric. When the ultraviolet light beam 164 is incident on a surface 174 (e.g., a metal surface or a dielectric surface) at a location proximate the volume that will contain the plasma, the surface 174 can emit one or more electrons into the region 502. In some embodiments, an instantaneous output power of the ultraviolet (UV) light source 160 at the time of plasma ignition can be about 1 Watt or more. The wavelength of at least part of the radiation may be less than about 250 nm, being in the hard UV band. This can be because the photo-emission of an electron from an insulator requires such photon energy that it can raise a valence electron past the conduction band and into the free electron energy space. For photoemission from metal, photon energy from the ultraviolet light source 160 can raise an electron from a conduction band to a free state. In some embodiments, the photo-electron emission from the surface 174 of the UV emission assembly 162 can include at least 100 electrons.

In some embodiments, electrons emitted from the surface 174 can then be accelerated by electrical fields in the plasma region 502 to cause ionization of the gas in the plasma chamber 120. The ionization can then provide additional electrons that take part in exponential growth "avalanche" of ionization which forms the plasma. In some embodiments (not shown in FIG. 5), an interior volume-facing surface irradiated with ultraviolet radiation can be a part of a dielectric wall of a plasma chamber, as described above in FIG. 3. The dielectric wall can have substantial induction electric fields when an RF power is being provided. In some embodiments (not shown in FIG. 5), ultraviolet irradiated surface can be a metal surface on an interior wall of a plasma chamber that has a line of sight to a region that will contain plasma after ignition, as described above in FIG. 4.

As can be seen in FIG. 5, the ultraviolet light beam 164 is reflected onto the surface 174 via a reflective element (e.g., a mirror) 168. Electrons 176 emitted from the surface 174 are emitted directly into the region 502 that will contain plasma after ignition.

The vacuum window 172 separates the lamp 160 from the plasma chamber interior 125. The vacuum window 172 can be an ultraviolet transmissive window. For instance, the window 172 can have at least one of: synthetic quartz, UV-grade sapphire, magnesium fluoride (MgF2) material, or calcium fluoride (CaF2) material. As another example, a space between the ultraviolet light source(s) and the window can be filled with a gas (e.g., helium or nitrogen) to reduce absorption by atmospheric oxygen.

In some embodiments (not shown in FIG. 5), the UV emission assembly can be a sealed chamber having at least two electrodes and a high-pressure inert gas such as xenon. The vacuum window can in part be made of a UV transmissive material such as synthetic quartz. Ignition of plasma can be then facilitated by supplying appropriate RF power to the inductive coupling element while there is fast pulsed DC power to the electrodes in the UV emission assembly such that that the UV emission assembly can produce copious UV radiation that illuminates dielectric wall(s) and/or metal wall(s) of the plasma chamber.

Figure 6:
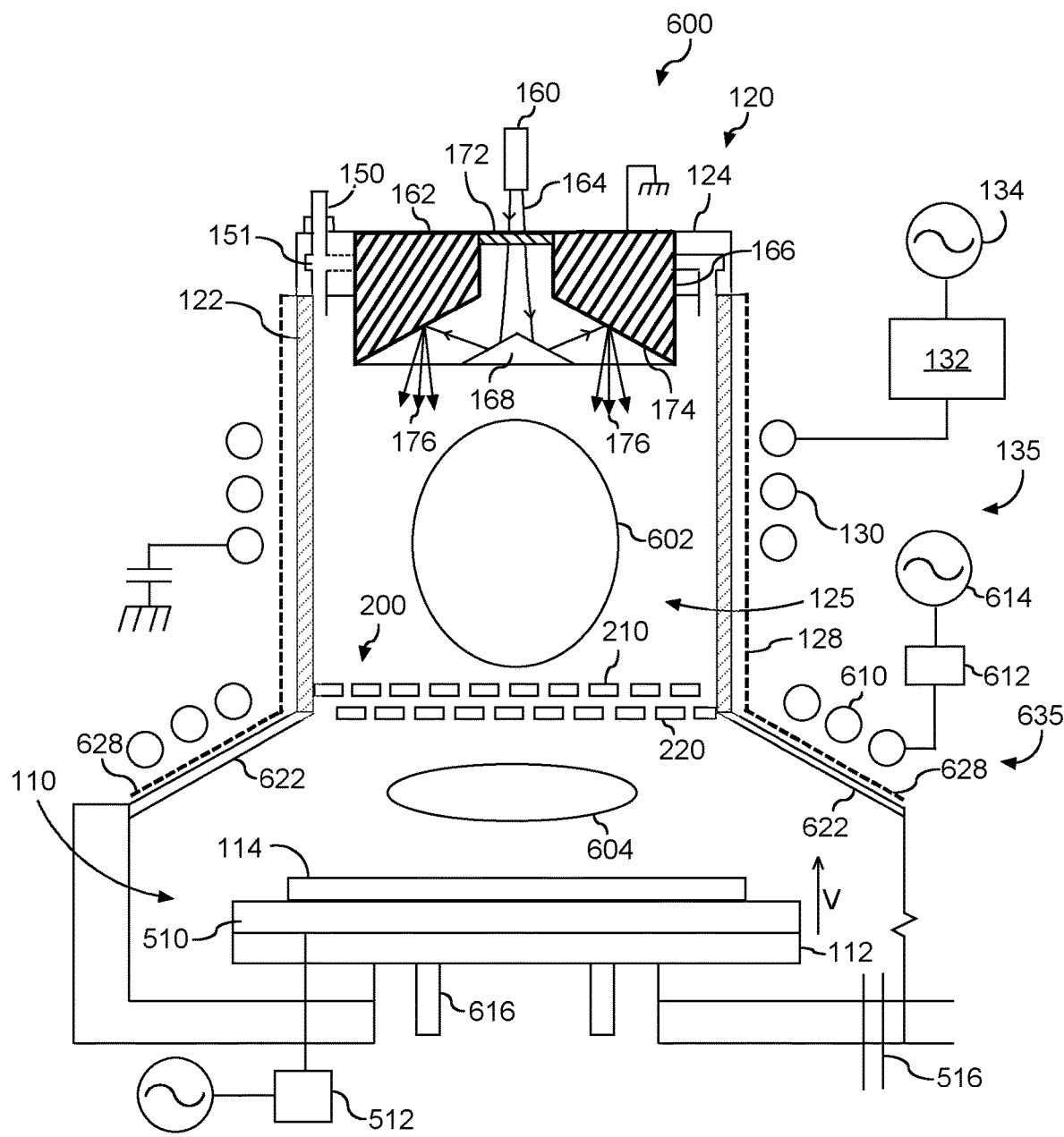
FIG. 6 depicts an example plasma processing apparatus according to example embodiments of the present disclosure.

FIG. 6 depicts a plasma processing apparatus 600 similar to that of FIG. 1 and FIG. 5. More particularly, plasma processing apparatus 600 includes a processing chamber 110 and a plasma chamber 120 that is separated from the processing chamber 110. Processing chamber 110 includes a substrate holder or workpiece support 112 operable to hold a workpiece 114 to be processed, such as a semiconductor wafer. In this example illustration, a plasma is generated in plasma chamber 120 (i.e., plasma generation region) by an inductively coupled plasma source 135 and desired gas phase species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 600 can include an optional grounded Faraday shield 128 to reduce capacitive coupling of the induction coil 130 to the plasma.

As shown in FIG. 6, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

The example plasma processing apparatus 600 of FIG. 6 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 810 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The workpiece support 112 can be movable in a vertical direction noted as "V." For instance, the workpiece support 112 can include a vertical lift 816 that can be configured to adjust a distance between the workpiece support 112 and the separation grid assembly 200. As one example, the workpiece support 112 can be located in a first vertical position for processing using the remote plasma 602. The workpiece support 112 can be in a second vertical position for processing using the direct plasma 604. The first vertical position can be closer to the separation grid assembly 200 relative to the second vertical position.

The plasma processing apparatus 600 of FIG. 6 includes a bias source having bias electrode 510 in the workpiece support 112. The bias electrode 510 can be coupled to an RF power generator 514 via a suitable matching network 512. The processing chamber 110 can include a gas exhaust port 516 for evacuating a gas from the processing chamber 110.

According to example aspects of the present disclosure, ignition of inductively coupled plasma can be improved with an ultraviolet light source that emits an ultraviolet light beam onto a dielectric wall and/or a metal surface at a location proximate the region wherein there will be plasma once there is ignition of the plasma. As such, less power can be used to ignite the plasma with better igniting repeatability and to reduce a direct electric field ion bombardment to a dielectric window.

As can be seen in FIG. 6, the plasma processing chamber 600 further includes an ultraviolet light source 160 and a UV emission assembly 162.

The ultraviolet light source 160 is mounted external to the plasma chamber 120 for the inductively coupled plasma source 135 such that radiation from the ultraviolet light source 160 can illuminate an inner wall of the metal top structure 162 prior to or during ignition of the plasma. The ultraviolet light source 160 emits one or more ultraviolet light beams 164 (e.g., in a wavelength range of about 600 nanometers to about 250 nanometers) into the plasma chamber 120 through the UV transmissive window 172. The ultraviolet light source 160 can be a CW lamp or a pulsed lamp. Examples of the ultraviolet light source 160 can include a xenon arc flashlamp, deuterium lamp, an excimer RF/pulse xenon lamp, or any other suitable light source that emits an ultraviolet light beam. For instance, the ultraviolet light source 160 can be turned on or the ultraviolet light source 160 can start pulsing to illuminate a part of an interior surface of the UV emission assembly 162, prior to or simultaneous with a turning-on of RF power 134 to ignite the plasma in the plasma chamber 120. Radiation from the ultraviolet light source 160 can be maintained at least until the plasma attains a substantial fraction of its ultimate density. As such, reliability of ignition and growth of the plasma can be accelerated and improved.

In some embodiments, to reduce heat buildup in the ultraviolet light source 160, the ultraviolet light source 160 can be pulsed with multiple rapid pulses at very short intervals (e.g., less than 10 milliseconds). The ultraviolet light source 160 can start pulsing prior to or just following the time of initiation of RF power 134 supplied to the inductively coupled source 135. In some embodiments, the ultraviolet radiation pulses can have a frequency of at least about 300 per second so that multiple pulses can contribute ultraviolet photons to an ignition process. As such, in some embodiments ultraviolet assisted plasma ignition can only take about 20 milliseconds or less.

In some embodiments, ultraviolet radiation from the ultraviolet light source 160 can promote plasma ignition and growth by ejecting photo-electrons from an irradiated surface(s) 174 proximate the chamber interior that can include the plasma region 602 as the RF power 134 is applied to the inductively coupled plasma source 135, as further described below.

In some embodiments (not shown in FIG. 6), the plasma processing apparatus 600 can include a controller that controls the ultraviolet light source 160 to emit the ultraviolet light beam. The controller (e.g., a computer, microcontroller(s), other control device(s), etc.) can include one or more processors and one or more memory devices. The one or more memory devices can store computer-readable instructions that when executed by the one or more processors cause the one or more processors to perform operations, such as turning on the ultraviolet light source to emit the ultraviolet light beam to impinge on a metal surface or a dielectric surface prior to or during ignition of a plasma, or other suitable operation.

The UV emission assembly 162 includes one or more walls 166, one or more reflective elements (e.g., mirrors) 168 and a vacuum window 172. The wall(s) 166 is grounded. At least a portion of the top structure 162 can be metal, and/or dielectric. When the ultraviolet light beam 164 is incident on a surface 174 (e.g., a metal surface or a dielectric surface) at a location proximate the volume that will contain plasma, the surface 174 can emit one or more electrons into that region 602. In some embodiments, an instantaneous output power of ultraviolet radiation from the light source 160 at the time of plasma ignition can be about 10 milliwatts and more preferably 0.1 Watt or more. UV radiation is employed because the photo-emission of an electron from an insulator requires such photon energy that it can raise a valence electron past the conduction band and into the free electron energy space. For photoemission from metal, photon energy from the ultraviolet light source 160 can raise an electron from a conduction band to a free state. In some embodiments, the photo-electron emission from the surface 174 of the UV emission assembly 162 can include at least 100 electrons.

In some embodiments, electrons emitted from the surface 174 can then be accelerated by electrical fields in the plasma region 602 to cause ionization of the gas in the interior of the chamber 120 where plasma will be located. The ionization can then provide additional electrons that take part in exponential growth "avalanche" of ionization and resultant electron density, which forms the plasma. In some embodiments (not shown in FIG. 6), a plasma-facing surface irradiated with ultraviolet radiation can be a part of a dielectric wall of a plasma chamber, as further described in FIG. 3. The dielectric wall can have substantial electric fields when an RF power is being provided to an inductive coupling antenna. In some embodiments (not shown in FIG. 6), ultraviolet irradiated surface can be a metal surface on an interior of a plasma chamber that has a line of sight to a region of the chamber interior that will contain plasma, as further described in FIG. 4.

As can be seen in FIG. 6, the ultraviolet light beam 164 is reflected onto the surface 174 via a reflective element (e.g., a mirror) 168. Electrons 176 emitted from the surface 174 directly into the region 602 that will contain plasma.

The vacuum window 172 separates the UV source 160 from the plasma chamber interior 125. The vacuum window 172 can be an ultraviolet transmissive window. For instance, the window 172 can have at least one of: synthetic quartz, UV-grade sapphire, magnesium fluoride (MgF2) material, or calcium fluoride (CaF2) material. As another example, a space between the ultraviolet light source(s) and the window can be filled with a gas (e.g., helium or nitrogen) to reduce UV absorption by atmospheric oxygen.

In some embodiments (not shown in FIG. 6), the UV emission assembly can be a sealed chamber having at least two electrodes and a high-pressure inert gas such as xenon. The vacuum window can in part be made of a UV transmissive material such as synthetic quartz. Ignition of plasma can be facilitated by supplying appropriate RF power to the inductive coupling antenna at the same time as supplying pulsed DC power to the electrodes in the UV emission assembly such that that the UV emission assembly can produce copious UV radiation that illuminates dielectric wall(s) and/or metal wall(s) of the plasma chamber.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:
1. A plasma processing apparatus, comprising:
a plasma chamber comprises a plasma region;
a dielectric wall forming at least a portion of the plasma chamber;
an inductive coupling element located proximate the dielectric wall; and an ultraviolet light source configured to emit an ultraviolet light beam through an ultraviolet emission assembly, the ultraviolet emission assembly comprises:

one or more metal surfaces facing an interior volume of the plasma chamber, the one or more metal surfaces arranged to emit one or more electrons into the plasma region; and one or more reflective elements configured to reflect the ultraviolet light beam onto the one or more metal surfaces.

2. The plasma processing apparatus of claim 1, wherein the one or more metal surface configured to emit at least about 1000 electrons in a pulse into the plasma region.

3. The plasma processing apparatus of claim 1, wherein the one or more metal surfaces are electrically grounded.

4. The plasma processing apparatus of claim 1, wherein the ultraviolet light beam has a wavelength in a range of about 100 nanometers to about 250 nanometers.

5. The plasma processing apparatus of claim 1, further comprising an electrostatic shield located between the dielectric wall and the inductive coupling element.

6. The plasma processing apparatus of claim 1, wherein the ultraviolet emission assembly further comprises:

a vacuum window separating the ultraviolet light source from the one or more metal surface and the one or more reflective elements.

7. The plasma processing apparatus of claim 1, wherein the ultraviolet emission assembly further comprises:

a vacuum window, the ultraviolet light source located adjacent the vacuum window, wherein the ultraviolet light beam passes through the vacuum window.

8. The plasma processing apparatus of claim 7, wherein the vacuum window is at least partially transparent to the ultraviolet light beam.

9. The plasma processing apparatus of claim 8, wherein the vacuum window comprises at least one of: synthetic quartz, UV-grade sapphire, magnesium fluoride ($MgF_2$) material, or calcium fluoride ($CaF_2$) material.

10. The plasma processing apparatus of claim 8, wherein a space between the ultraviolet light source and the vacuum window is filled with an inert gas to reduce absorption by atmospheric oxygen, the inert gas comprising at least one of: helium, argon or nitrogen.

11. The plasma processing apparatus of claim 1, wherein the ultraviolet light source emits the ultraviolet light beam onto the one or more metal surfaces from a location outside the plasma chamber.

12. The plasma processing apparatus of claim 1, wherein the ultraviolet light source is a pulsed lamp.

13. The plasma processing apparatus of claim 1, wherein the ultraviolet light source comprises at least one of: a xenon arc flashlamp, deuterium lamp, or an excimer RF/pulse xenon lamp.

14. The plasma processing apparatus of claim 13, wherein the pulsed lamp produces a plurality of pulses with a frequency of at least about 100 per second such that the plurality of pulses contributes ultraviolet photons to be incident on the one or more metal surfaces.

15. The plasma processing apparatus of claim 1, wherein the plasma chamber is separated from a processing chamber having a workpiece support configured to support a workpiece.

* * * * *